(12) United States Patent
Tschanz et al.

(10) Patent No.: US 6,429,711 B1
(45) Date of Patent: Aug. 6, 2002

(54) STACK-BASED IMPULSE FLIP-FLOP WITH STACK NODE PRE-CHARGE AND STACK NODE PRE-DISCHARGE

(75) Inventors: James W. Tschanz, Hillsboro, OR (US); Manoj Sachdev, Waterloo (CA); Siva G. Narendra; Vivek K. De, both of Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/608,314

(22) Filed: Jun. 30, 2000

(51) Int. Cl.$^7$ ................................................. H03K 3/356

(52) U.S. Cl. ...................... 327/211; 327/201; 326/97; 365/189.05

(58) Field of Search ................................. 327/185, 198, 327/199, 200–203, 204, 207–212, 214; 326/93–98, 40; 365/189.05, 205

(56) References Cited

U.S. PATENT DOCUMENTS

| | | | | |
|---|---|---|---|---|
| 5,990,717 A | * | 11/1999 | Parttovi et al. | 327/210 |
| 6,087,872 A | * | 7/2000 | Partovi et al. | 327/201 |
| 6,111,446 A | * | 8/2000 | Keeth | 327/258 |

* cited by examiner

*Primary Examiner*—Timothy P. Callahan
*Assistant Examiner*—Minh Nguyen
(74) *Attorney, Agent, or Firm*—Blakely, Sokoloff, Taylor & Zafman LLP

(57) ABSTRACT

A circuit including a data signal input to receive a data signal, a clock signal input to receive a clock signal, a clocking circuit to generate control clocks, and a multiple input conditional inverter to receive the data signal and control clocks, and to generate an output. The circuit also includes at least one stack node pre-charging transistor coupled to a high signal transfer node in the multiple input conditional inverter and at least one stack node pre-discharging transistor coupled to a low signal transfer node in the multiple input conditional inverter. A keeper circuit receives the output of the multiple input conditional inverter and a buffer circuit receives the output of the multiple input conditional inverter and generates the circuit output.

15 Claims, 8 Drawing Sheets

STACK-BASED IMPULSE FLIP-FLOP WITH STACK NODE PRE-CHARGE AND STACK NODE PRE-DISCHARGE

FIELD OF THE INVENTION

The present invention pertains to the field of electronic circuits. More particularly, the present invention relates to the design of flip-flop circuitry.

BACKGROUND OF THE INVENTION

Flip-flop circuits are used to maintain an output state (Q) based upon the sampling of an input data signal (D) at a particular point in time determined by a clock signal (CLK). The sampling of the input data signal is activated either by the edge or the level of the clock signal. At all other times, the output of the flip-flop circuit will not respond to changes in the input data signal.

Typical flip-flops have shortcomings. One such typical flip-flop is the master-slave flip-flop, which consists of two stages, the master and the slave. To change the output of the master-slave flip-flop, a signal must propagate through both the master and the slave stages. In fast circuits, this delay can pose problems.

Additionally, the number of logic devices used to build both the master and the slave can be large. This large number of devices may consume more power than desirable.

Also, the master-slave flip-flop requires that the data input be present and stable for a given time before the clock activates the sampling for the flip-flop to accurately respond to the data input. This is called the data "setup" time. Setup time affects the speed at which a flip-flop may operate. Thus, a setup time may pose a problem.

BRIEF DESCRIPTION OF THE DRAWINGS

The present invention is illustrated by way of example and not limitation in the figures of the accompanying drawings, in which like references indicate similar elements and in which.

DETAILED DESCRIPTION

A method and apparatus for a flip-flop are described. The discloses a stack-node flip flop with pre-charging and pre-discharging of intermediate nodes. Because of the pre-charging and pre-discharging of intermediate nodes within the flip-flops, the flip-flops are extremely fast. The flip-flops do not require any setup time. The output of the flip-flops is also buffered. This buffering isolates the keeper circuit from the load. The flip-flops require fewer transistors than conventional flip-flop implementations, so may be smaller in size and/or consume less power.

Figure 1:
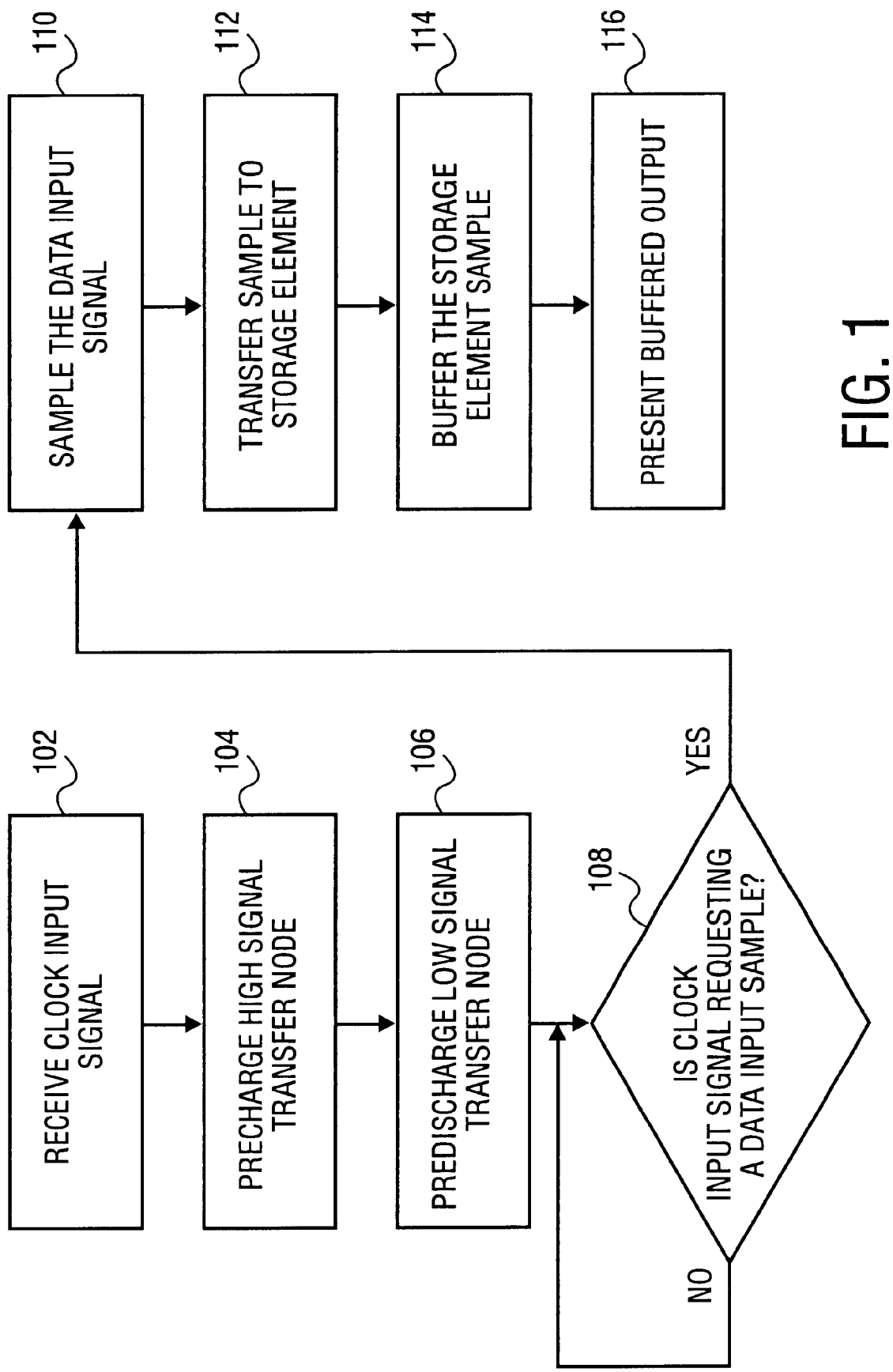
FIG. 1 is a flow diagram of the operation stack-based impulse flip-flop with stack node pre-charge and pre-discharge.

FIG. 1 is a flow diagram of the operation stack-based impulse flip-flop with stack node pre-charge and pre-discharge. An input signal in the form of a clock is received 102. The clock input signal is used to pre-charge an intermediate node for transferring a high signal 104 and to pre-discharge an intermediate node for transferring a low signal 106. The clock input signal is next checked to determine if it is requesting a data input sample 108. If the input clock signal is not requesting a data input sample, then the input clock signal is checked again at 108. If the input clock signal is requesting a data input sample, then the data input signal is sampled 110. After the data input signal is sampled 110, the data input signal sample is transferred to a storage element 112. The storage element, representing the data input signal sample, is then buffered 114, and the buffered signal is presented as the output 116. It will be understood that all of the processes described are not necessary for the operation of the present invention.

Figure 2:
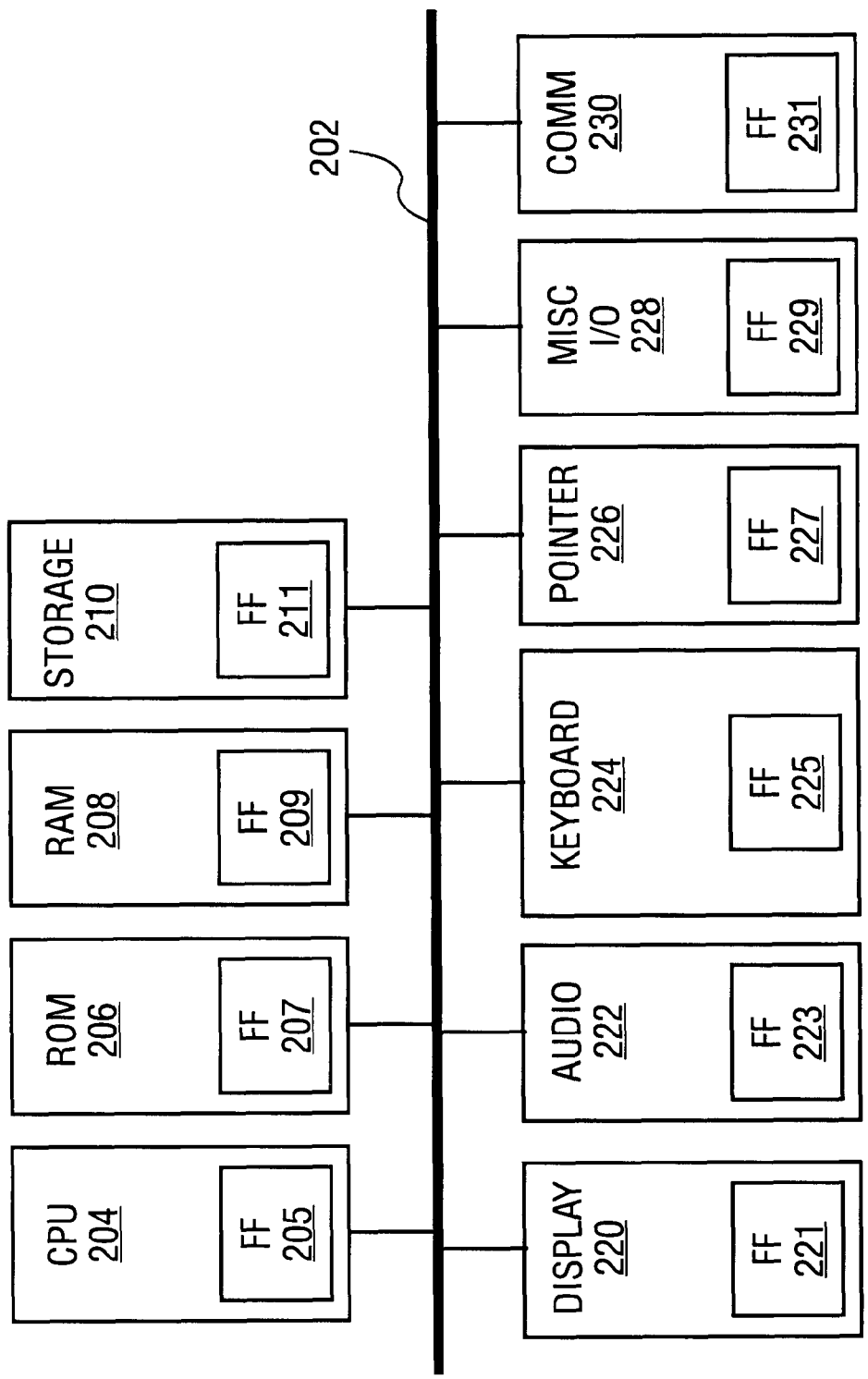
FIG. 2 is a block diagram of a computer system.

FIG. 2 is a block diagram of a computer system. The block diagram is a high level conceptual representation and may be implemented in a variety of ways and by various architectures. Bus system 202 interconnects a Central Processing Unit (CPU) 204, Read Only Memory (ROM) 206, Random Access Memory (RAM) 208, storage 210, display 220, audio, 222, keyboard 224, pointer 226, miscellaneous input/output (I/O) devices 228, and communications 230. The bus system 202 may be for example, one or more of such buses as a system bus, Peripheral Component Interconnect (PCI), Advanced Graphics Port (AGP), Small Computer System Interface (SCSI), Institute of Electrical and Electronics Engineers (IEEE) standard number 1394 (FireWire), etc. The CPU 204 may be a single, multiple, or even a distributed computing resource. The ROM 206 may be any type of non-volatile memory, which may be programmable such as, mask programmable, flash, etc. RAM 208 may be, for example, static, dynamic, synchronous, asynchronous, or any combination. Storage 210, may be Compact Disc (CD), Digital Versatile Disk (DVD), hard disks, optical disks, tape, flash, memory sticks, video recorders, etc. Display 220 might be, for example, a Cathode Ray Tube (CRT), Liquid Crystal Display (LCD), a projection system, Television (TV), etc. Audio 222 may be a monophonic, stereo, three dimensional sound card, etc. The keyboard 224 may be a keyboard, a musical keyboard, a keypad, a series of switches, etc. The pointer 226, may be, for example, a mouse, a touchpad, a trackball, joystick, etc. I/O devices 228, might be a voice command input device, a thumbprint input device, a smart card slot, a Personal Computer Card (PC Card) interface, virtual reality accessories, etc., which may optionally connect via an input/output port 229 to other devices or systems. An example of a miscellaneous I/O device 228 would be a Musical Instrument Digital Interface (MIDI) card. Communications device 230 might be, for example, an Ethernet adapter for local area network (LAN) connections, a satellite connection, a settop box adapter, a Digital Subscriber Line (xDSL) adapter, a wireless modem, a conventional telephone modem, a direct telephone connection, a Hybrid-Fiber Coax (HFC) connection, cable modem, etc. Note that depending upon the actual implementation of a computer system, the computer system may include some, all, more, or a rearrangement of components in the block diagram. For example, a thin client might consist of a wireless hand held device that lacks, for example, a traditional keyboard. Thus, many variations on the system of FIG. 2 are possible.

The present invention is capable of being embodied in each of the blocks of the computer system described above. Flip-flop 205 in the CPU 204 may be used to store the results of processing. Flip-flop 205 may be used to latch the signals received from the bus system 202. A flip-flop 207 used in ROM 206, may store the results of an access for presentation as an output on bus system 202. Likewise, the ROM 206 may embody the flip-flop 207 to latch an address that the bus system 202 presents to the ROM 206. A flip-flop 209 used in RAM 208, may store the results of an access for presentation as an output on bus system 202. RAM 208 may embody the flip-flop 209 to latch an address that the bus system 202 presents to the RAM 208. The RAM 208 may also use a flip-flop 209 as a storage element for either main storage, or cache storage. Storage 210 may for example, embody a flip-flop 211, as an output storage device to present its output to the bus 202. Flip-flop 211 may also store such things as user options for operation of the storage 210 which are received from the bus 202. Display 220 might use flip-flop 221 to latch a display signal, for example, if display 220 is an LCD display, flip-flop 221 might be used in an active-matrix as the storage element for a pixel. If display 220 is a CRT, flip-flop 221, might be used to store correction parameters, such as pin cushion correction. Audio 222 may use flip-flop 223 to store input and/or output signals received/sent to bus system 202. The keyboard 224 may use flip-flop 225 to store the status of indicators such as the numeric lock, caps lock, scroll lock, etc. The pointer 226, for example as a mouse, may use flip-flop 227 to store the status of a user click. An I/O device 228, for example in a thumbprint input device, may use flip-flop 229 to store the results of a thumbprint scan. Communications device 230 might be, for example, an Ethernet adapter which may use flip-flop 231 to store the results of a received packet.

Figure 3:
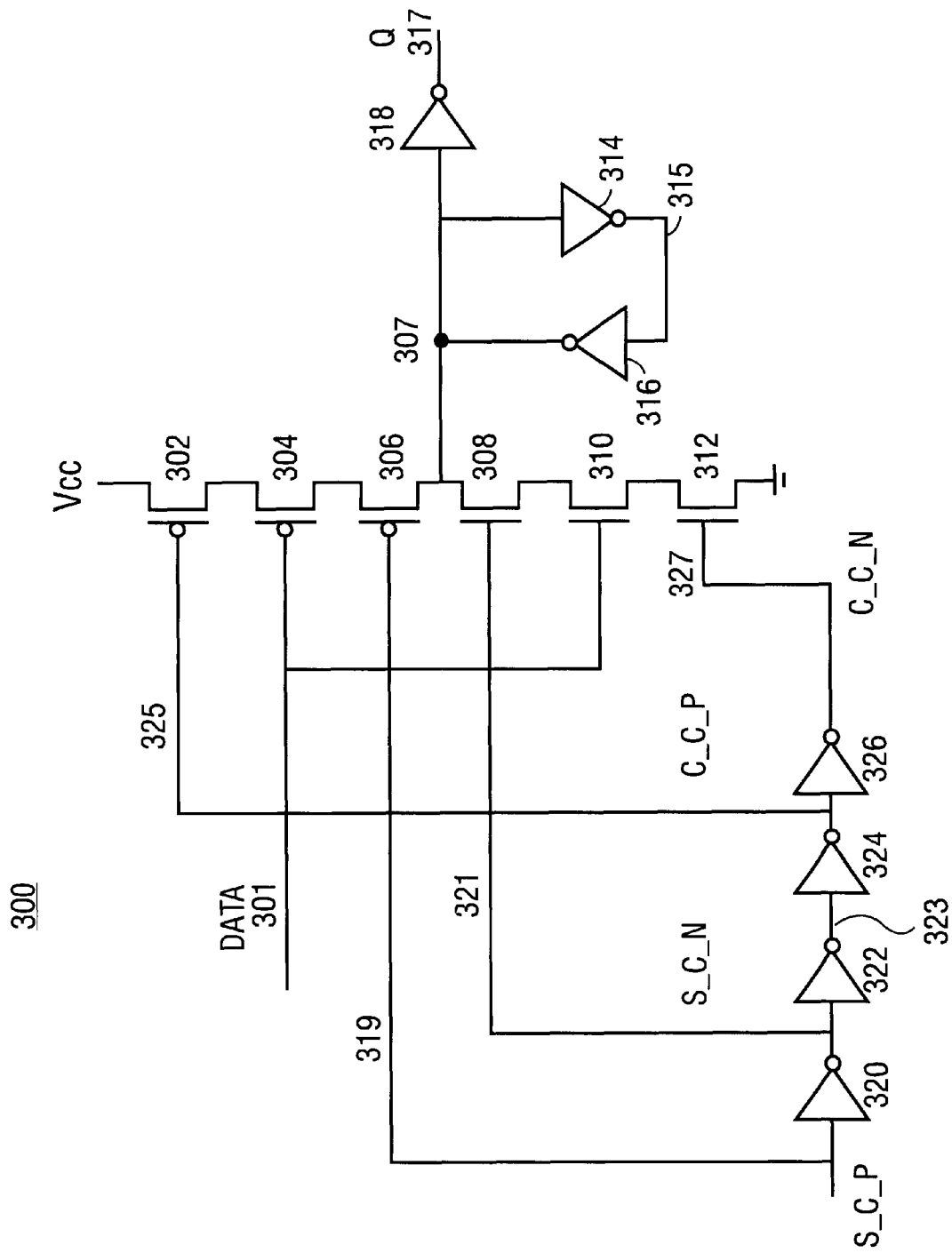
FIG. 3 is a circuit diagram of an embodiment of a stack-based impulse flip-flop.

FIG. 3 is a circuit diagram of an embodiment of a stack-based impulse flip-flop. Flip-flop 300 includes transistors 302, 304, 306, 308, 310, 312, data input 301, clock input 319 and inverters 314, 316, 318, 320, 322, 324, 326.

Transistors 302, 304, 306 are P-type transistors and transistors 308, 310, 312 are N-type transistors. The source of transistor 302 is connected to a positive power supply Vcc. The source of transistor 312 is connected to a less positive power supply than Vcc, designated as ground by the ground symbol. The drain of transistor 302 is connected to the source of a P-type transistor 304. The drain of transistor 304 is connected to the source of a P-type transistor 306. The drain of transistor 306 is connected to the drain of a N-type transistor 308. The source of transistor 308 is connected to the drain of a N-type transistor 310. The source of transistor 310 it connected to the drain of transistor 312.

Flip-flop 300, has a data input 301 to receive data. The data input 301 is connected to the gate of a P-type transistor 304 and the gate of an N-type transistor 310.

Flip-flop 300, has a clock input 319, denoted s_c_p (sample clock p-type transistor), to receive a clock. The s_c_p input 319 is connected to the input of an inverter 320, and the gate of transistor 306. The output of inverter 320 is denoted as s_c_n (sample clock n-type transistor) 321, and is connected to the input of inverter 322, and the gate of transistor 308. The output of inverter 322, denoted 323, is coupled to the input of inverter 324. The output of inverter 324, denoted c_c_p (close clock p-type) 325, is coupled to the input of inverter 326, and the gate of transistor 302. The output of inverter 326, denoted c_c_n (close clock n-type) 327, is coupled to the gate of transistor 312. The drain of transistor 306 and the drain of transistor 308 are coupled to the node 307. Node 307 is coupled to the input of inverter 314. The output of inverter 314, denoted as 315, is coupled to the input of inverter 316. The output of inverter 316 is coupled to the input of inverter 314. The node 307 is coupled to the input of the inverter 318. The output of inverter 318, denoted as Q 317, is the output of the flip-flop 300.

Figure 4:
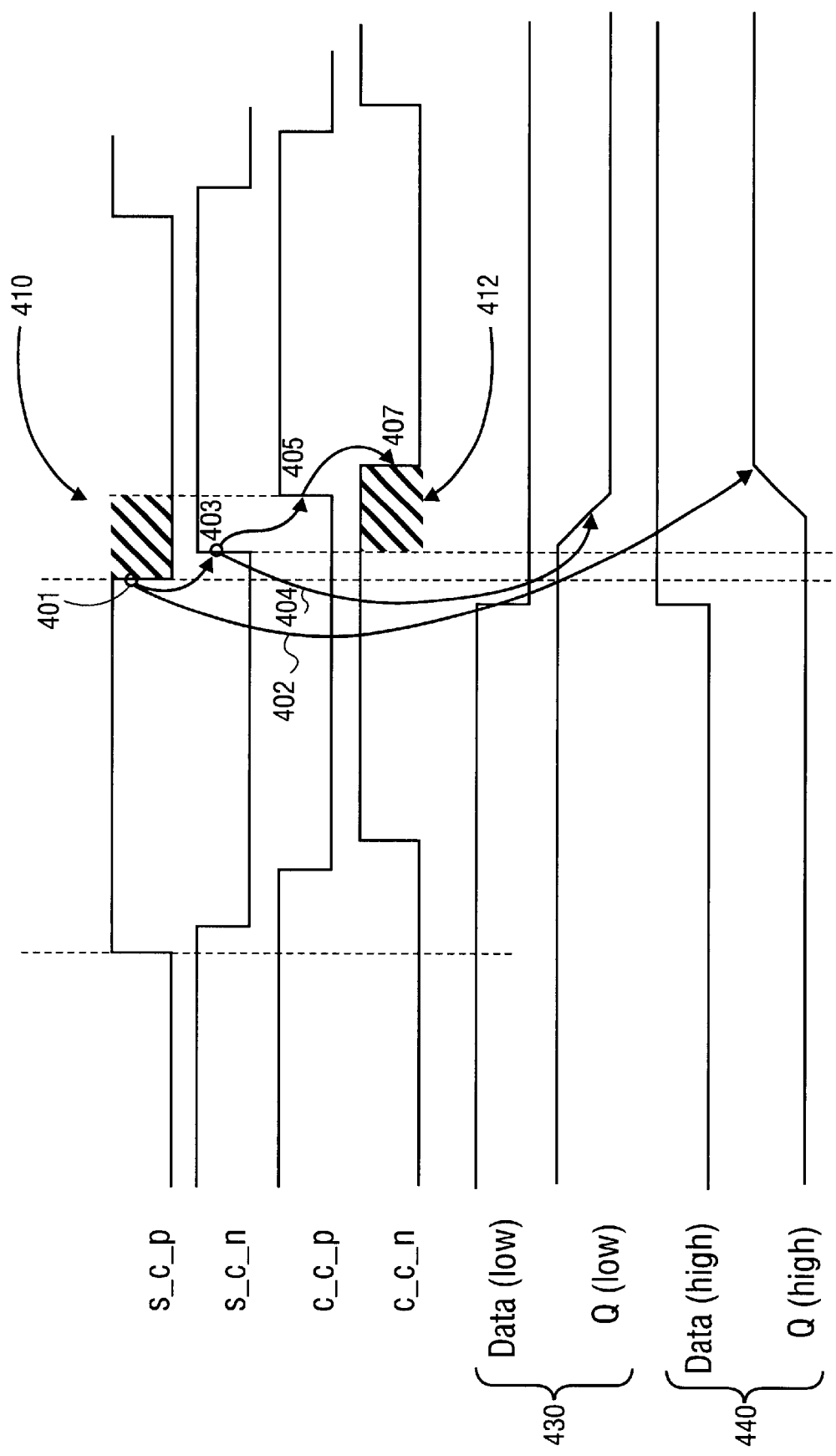
FIG. 4 is a waveform diagram illustrating the operation of the circuit depicted in FIG. 3.

FIG. 4 is a waveform diagram illustrating the operation of the circuit depicted in FIG. 3. Operation is illustrated for the flip-flop 300 when the Data is in a binary low state at the sequence labeled 402, and operation is illustrated for the flip-flop 300 when the Data is in a binary high state at the sequence labeled 404.

Sequence 402 begins when the s_c_p signal makes a high to low transition at 401. This s_c_p high to low transition propagates through the flip-flop circuitry and causes the s_c$_{13}$_n low to high transition 403, the c_c_p 405 low to high transition, the c_c_n high to low transition 407. The s_c_p transition from high to low 401 "samples" the Data at pmos sampling window 410. Transistor 306 is turned "on" at 401 and transistor 302 is turned "off" at 405. The interval when both transistors 306 and 302 are on is the pmos sampling window 410. If data is in a low state, as in the example shown at 430, transistor 304 will also be "on". The result is that the output Q is in a low state.

Sequence 404 also begins when the s_c_p signal makes a high to low transition at 401. This s_c_p high to low transition propagates through the flip-flop circuitry and causes the s_C_n low to high transition 403, the c_c_p 405 low to high transition, the C_c_n high to low transition 407. The s_C_n transition from low to high 403 "samples" the Data at nmos sampling window 412. Transistor 308 is turned "on" at 403 and transistor 312 is turned "off" at 407. The interval when both transistors 308 and 312 are on is the nmos sampling window 412. If data is in a high state, as in the example shown at 440, transistor 310 will also be "on". The result is that the output Q is in a high state.

Operation of the flip-flop 300 may be more easily understood by considering transistors 302, 304, 306, 308, 310, and 312 as a "gated" inverter. When the inverter is "active," a signal, dependent on the state of Data 301, will be transferred at the "gated" output junction of 306 and 308, denoted as node 307. The signal at node 307 will be "kept" by the keeper circuit of 314 and 316, and the signal at node 307 will be buffered by inverter 318 and output as Q 317. When the "gated" inverter is not active, that is, it is no longer actively driving the node 307 and has entered a high impedance (Hi-Z) state, then the output Q 317 will be maintained because the keeper circuit has maintained the state when the "gated" inverter was actively driving node 307.

The "gated" inverter is actively driving node 307 toward a high state when the gates of transistors 302, 304, and 306, corresponding to the signals c_c_p 325, Data 301 and s_c_p 319 respectively, are in a low state. Conversely, the "gated" inverter is actively driving node 307 toward a low state when the gates of transistors 308, 310, and 312, corresponding to the signals s_c_n 321, Data 301 and c_c_n 327 respectively, are in a high state.

Flip-flop 300 be slowed down, however, by the build up of charge on the node between transistors 304 and 306 and the node between transistors 308 and 310 ("the intermediate nodes"). Capacitance on the intermediate nodes due to the transistors being connected in a stack, the wiring between the transistors or the transistors themselves causes charge to be stored on the intermediate nodes. Thus, when the clock signal causes the circuit to sample data, either all three nmos transistors 308, 310, 312 must be turned on and discharged to ground or all three pmos transistors 302, 304, 306 must be turned on and charged up to Vcc. The speed at which the output reaches the correct logic state (0 or 1) is dependent upon how quickly node 307 is charged and how much charge is stored on the intermediate nodes. Thus, charge on the intermediate nodes slows down the circuit.

Figure 5:
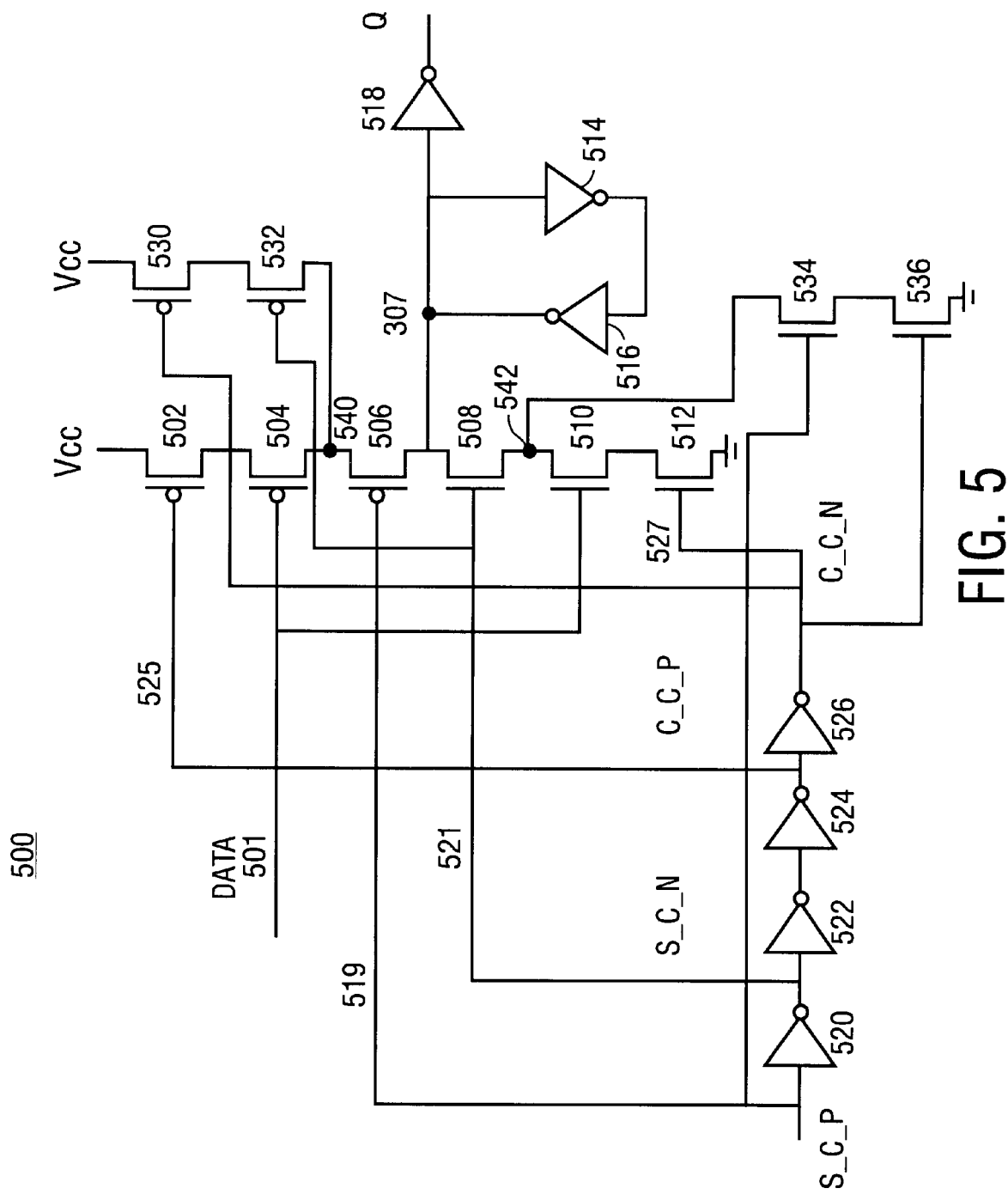
FIG. 5 is a circuit diagram of an embodiment of a stack-based impulse flip-flop with stack node pre-charge and pre-discharge.

FIG. 5 is a circuit diagram of an embodiment of a stack-based impulse flip-flop with stack node pre-charge and pre-discharge. Flip-flop 500, like flip-flop 300, includes transistors 502, 504, 506, 508, 510, 512, data input 501, clock input 519 and inverters 514, 516, 518, 520, 522, 524, 526. Flip-flop 500 further includes pre-charging transistors 530, 532 and pre-discharging transistors 534, 536.

The source of p-type transistor 530 is connected to a positive power supply Vcc. The source of n- type transistor 536 is connected to a less positive power supply than Vcc, designated as ground by the ground symbol. The drain of transistor 530 is connected to the source of p-type transistor 532. The drain of transistor 532 is connected to intermediate node 540. The drain of transistor 536 is connected to the source of n-type transistor 534. The source of transistor 534 is connected to intermediate node 542.

The gate of transistor 530 is connected to the output of inverter 526, denoted c_c_n 527. The gate of transistor 532 is connected to the output of inverter 520, denoted s_c_n 521. Thus, transistors 530 and 532 will both be on only when transistor 506 is off, ensuring that charges stored at output node 507 will not be changed by the pre-charging of intermediate node 540.

The gate of transistor 534 is connected to the clock input, denoted s_c_p 519. The gate of transistor 536 is connected to the output of inverter 526, denoted c_c_n 521. Thus, transistors 534 and 536 will both be on only when transistor 508 is off, ensuring that charges stored at output node 507 will not be changed by the pre-discharging of intermediate node 542. Because the transistors 530, 532, 534, 536 are controlled by the sampling and closing clocks, no additional control signals are necessary.

Figure 6:
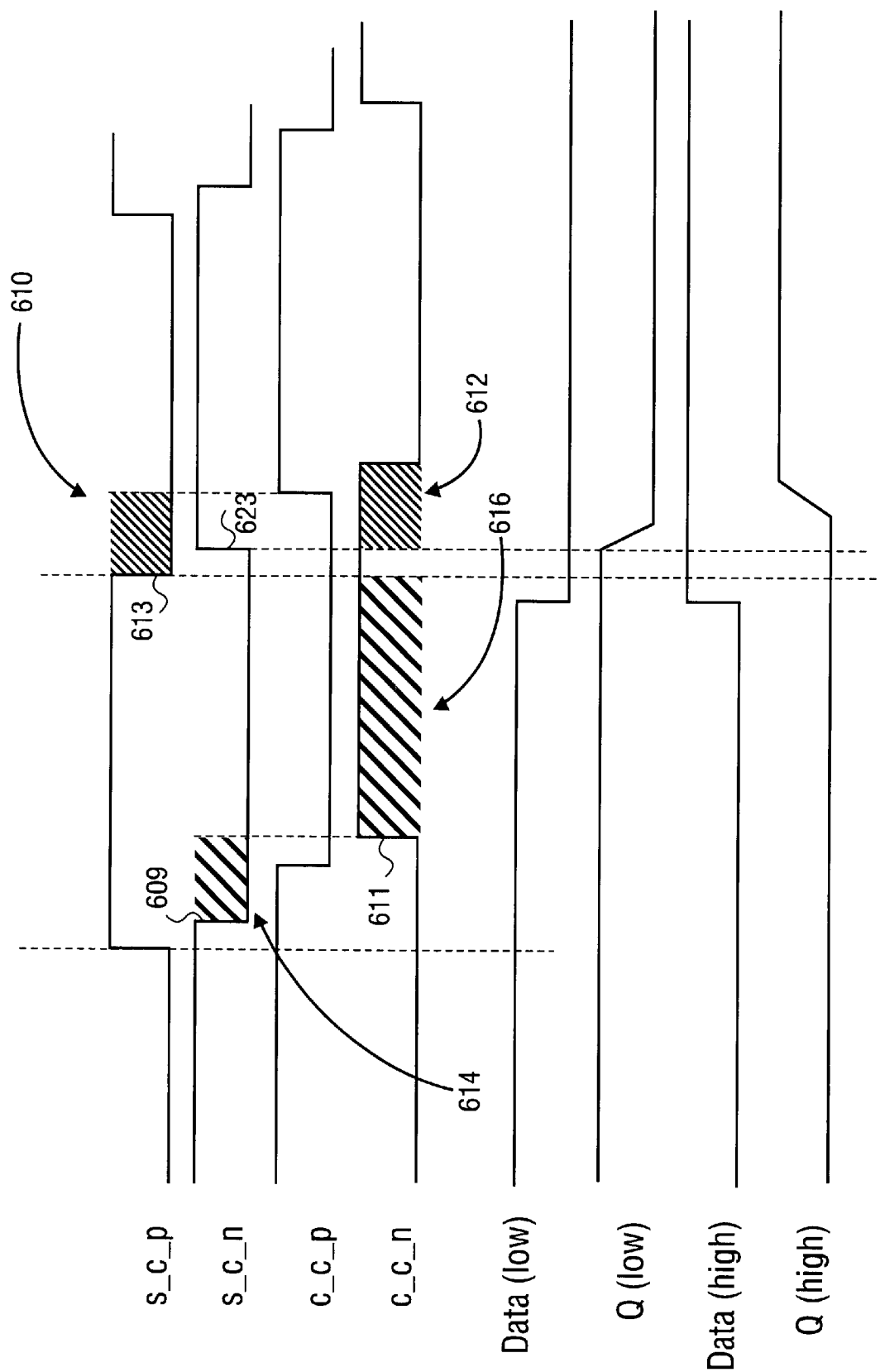
FIG. 6 is a waveform diagram illustrating the operation of the circuit depicted in FIG. 5.

FIG. 6 is a waveform diagram illustrating the operation of the circuit depicted FIG. 5. The s_c_p transition from high to low 613 "samples" the Data at pmos sampling window 610 and the s_c_n transition from low to high 623 "samples" the Data at nmos sampling window 612, as described above with reference to FIG. 4.

In the circuit depicted in FIG. 5, the s_c_n transition from high to low 609 turns "on" transistor 532. Transistor 530 is already on at this time because c_c_n is low. The c_c_n transition from low to high 611 turns "off" transistor 530. Thus, intermediate node 540 is pre-charged, before the sampling is started by the s_c_p transition from high to low 613, during the interval when both transistor 530 and transistor 532 are on, pmos pre-charge window 614.

The c_c_n transition from low to high 611 turns transistor 536 on. Transistor 534 is already on at this time because s_c_p is high. The s_c_p transition from high to low 613 turns off transistor 534. Thus, the intermediate node 542 is pre-discharged, before the sampling is started by the s_c_p transition from high to low 613, during the interval when both transistor 534 and transistor 536 are on, nmos pre-charge window 616.

Figure 7:
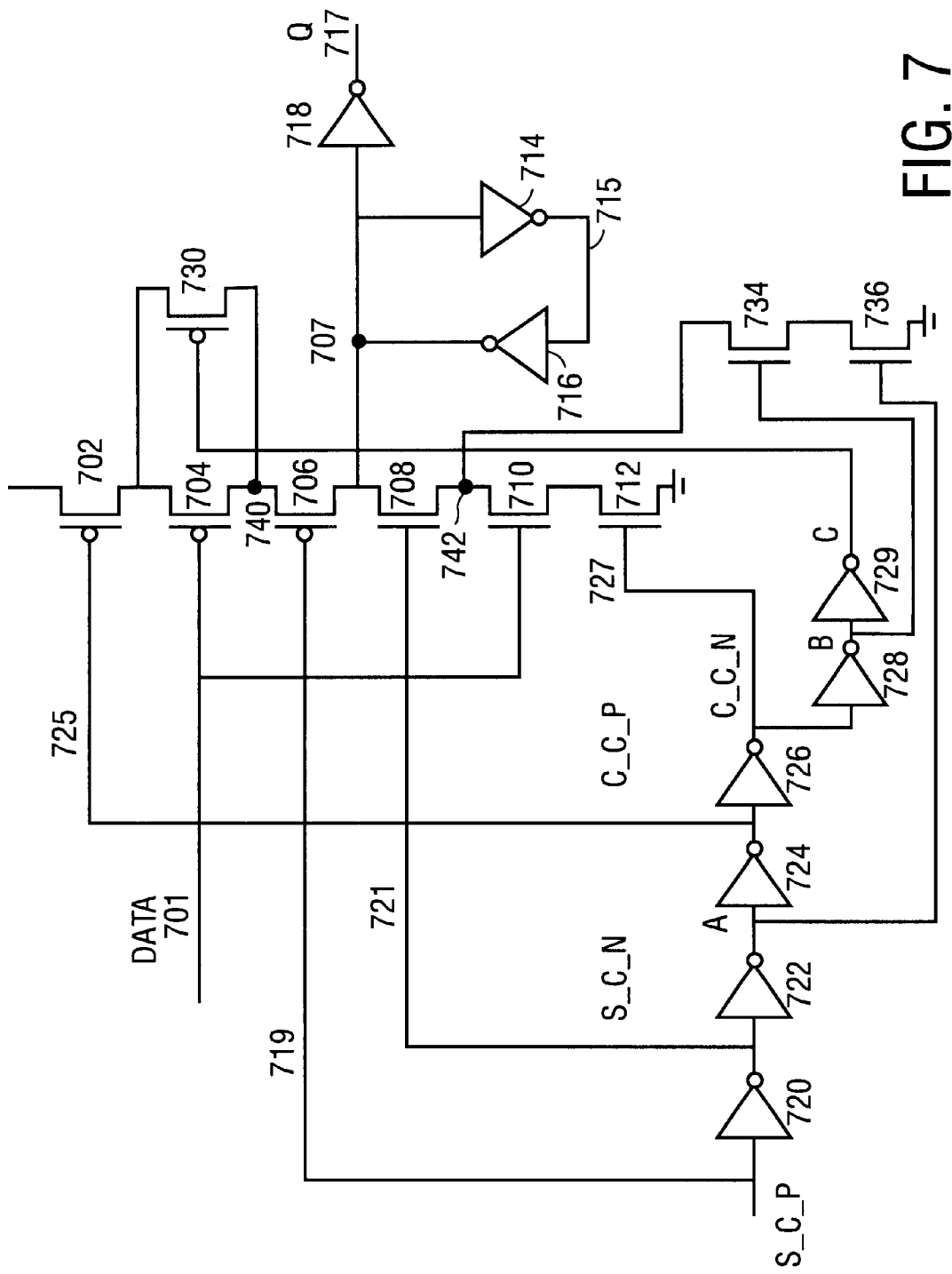
FIG. 7 is a circuit diagram of another embodiment of a stack-based impulse flip-flop with stack node pre-charge and pre-discharge.

FIG. 7 is a circuit diagram of another embodiment of a stack-based impulse flip-flop with stack node pre-charge and pre-discharge. Flip-flop 700, like flip-flop 300, includes transistors 702, 704, 706, 708, 710, 712, data input 701, clock input 719 and inverters 714, 716, 718, 720, 722, 724, 726. Flip-flop 700 further includes inverters 728, 729, pre-charging transistor 730 and pre-discharging transistors 734, 736.

The source of p-type transistor 730 is connected to the drain of transistor 702. The source of n-type transistor 736 is connected to a less positive power supply than Vcc, designated as ground by the ground symbol. The drain of transistor 730 is connected to the intermediate node 740. The drain of transistor 736 is connected to the source of n- type transistor 734. The source of transistor 734 is connected to intermediate node 742.

The output of inverter 726 is coupled to the input of inverter 728, denoted c_c_n 727. The output of inverter 728 is coupled to the input of inverter 729, and to the gate of transistor 734. The output of inverter 729 is coupled to the gate of transistor 730. The output of inverter 722 is coupled to the gate of transistor 736.

Intermediate node 740 will be pre-charged when both transistor 702 and transistor 730 are on. Transistors 702 and 730 will both be on only when transistor 706 is off, ensuring that charges stored at output node 707 will not be changed by the pre-charging of intermediate node 740.

Intermediate node 742 will be pre-charged when both transistor 734 and transistor 736 are on. Transistors 734 and 736 will both be on only when transistor 708 is off, ensuring that charges stored at output node 707 will not be changed by the pre-discharging of intermediate node 742.

Figure 8:
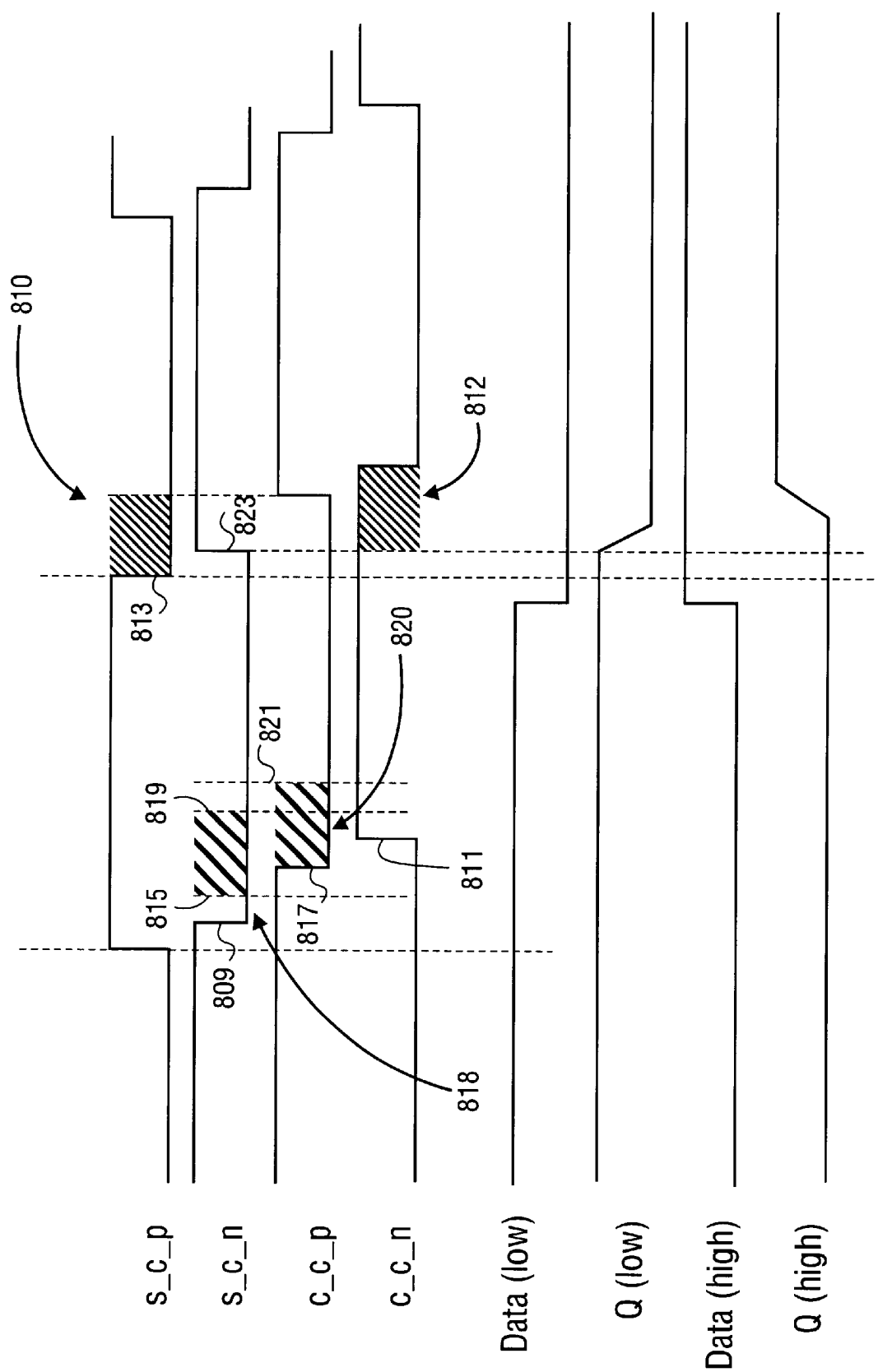
FIG. 8 is a waveform diagram illustrating the operation of the circuit depicted in FIG. 7.

FIG. 8 is a waveform diagram illustrating the operation of the circuit depicted in FIG. 7. The s_c_p transition from high to low 813 "samples" the Data at pmos sampling window 810 and the s_c_n transition from low to high 823 "samples" the Data at nmos sampling window 812, as described above with reference to FIG. 4.

In the circuit depicted in FIG. 7, the output of inverter 729, which is input into the gate of transistor 730, is three inverter delays behind c_c_p 725 and inverted. Thus, transistor 730 is on at c_c_p transition from high to low 817, which turns on transistor 702. Transistors 730 and 702 are both on for three inverter delays until the output of inverter 729 transitions from low to high 821. Intermediate node 740 is pre-charged, before the sampling is started by the s_c_p transition from high to low 813, during the interval when both transistor 730 and transistor 702 are on, pmos pre-charge window 820.

Transistor 736 receives the inverted s_c_n signal at its gate. Thus, the output of inverter 722 transitions from low to high 815, turning transistor 736 on, one inverter delay after transistor s_c_n transitions from high to low 809. The gate of transistor 734 receives the inverted c_c_n signal. Thus, the output of inverter 728 is high, and transistor 734 on, when the output of inverter 722 transitions from low to high 815. The output of inverter 728 transitions from high to low 819, turning off transistor 734, one inverter delay after c_c_n 727 transitions from low to high 811. Intermediate node 742 is pre-discharged during the interval when both transistor 734 and transistor 736 are on, nmos pre-charge window 818. The intermediate node 742 pre-discharge is completed, in this embodiment, before the sampling clock edge 813 arrives at the flip-flop 700. This allows the stack node pre-charge and pre-discharge to be more effective, especially for very fast clock cycles, although an additional three transistors are employed.

Thus, a method and apparatus for flip-flop have been described. Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

We claim:

1. A circuit comprising:
   a data signal input to receive a data signal;
   a clocking circuit to generate control clocks;
   a multiple input conditional inverter to receive the data signal and control clocks, and to generate an output;
   at least one stack node pre-charging transistor coupled to a high signal transfer node in the multiple input conditional inverter;
   at least one stack node pre-discharging transistor coupled to a low signal transfer node in the multiple input conditional inverter;
   a keeper circuit to receive the output of the multiple input conditional inverter; and
   a buffer circuit to receive the output of the multiple input conditional inverter and to generate a flip-flop circuit output;
   wherein the at least one stack node pre-charging transistor comprises a first pre-charging PMOS transistor including a gate, a source and a drain, and a second pre-charging PMOS transistor including a gate, a source and a drain,
   the source of the first pre-charging PMOS transistor being coupled to a positive supply voltage, the drain of the first pre-charging PMOS transistor being coupled to the source of the second pre-charging PMOS transistor, the drain of the second pre-charging PMOS transistor being coupled to the high signal transfer node.

2. The circuit of claim 1 wherein the gate of the first pre-charging PMOS transistor is coupled to receive a NMOS closing clock and the gate of the second pre-charging PMOS transistor is coupled to receive a NMOS sampling clock.

3. A circuit comprising:
   a data signal input to receive a data signal;
   a clocking circuit to generate control clocks;
   a multiple input conditional inverter to receive the data signal and control clocks, and to generate an output;
   at least one stack node pre-charging transistor coupled to a high signal transfer node in the multiple input conditional inverter;
   at least one stack node pre-discharging transistor coupled to a low signal transfer node in the multiple input conditional inverter;
   a keeper circuit to receive the output of the multiple input conditional inverter; and
   a buffer circuit to receive the output of the multiple input conditional inverter and to generate a flip-flop circuit output;
   wherein the at least one stack node pre-discharging transistor comprises a first pre-discharging NMOS Transistor including a gate, a source and a drain, and a second pre-discharging NMOS transistor including a gate, a source and a drain,
   the drain of the first pre-discharging NMOS transistor being coupled to the low signal transfer node, the source of the first pre-discharging NMOS transistor being coupled to the drain of the second pre-discharging NMOS transistor, and the drain of the second pre-discharging NMOS transistor being coupled to a supply voltage less positive than the positive supply voltage.

4. The circuit of claim 3 wherein the gate of the first pre-discharging NMOS transistor is coupled to receive a PMOS sampling clock and the gate of the second NMOS transistor is coupled to receive a NMOS closing clock.

5. The circuit of claim 3 wherein a gate of the first pre-discharging NMOS transistor is coupled to receive a NMOS closing clock through a first inverter and the gate of the second pre-discharging NMOS transistor is coupled to receive a NMOS sampling clock through a second inverter.

6. A circuit comprising:
   a data signal input to receive a data signal;
   a clocking circuit to generate control clocks;
   a multiple input conditional inverter to receive the data signal and control clocks, and to generate an output;
   at least one stack node pre-charging transistor coupled to a high signal transfer node in the multiple input conditional inverter;
   at least one stack node pre-discharging transistor coupled to a low signal transfer node in the multiple input conditional inverter;
   a keeper circuit to receive the output of the multiple input conditional inverter; and
   a buffer circuit to receive the output of the multiple input conditional inverter and to generate a flip-flop circuit output;
   wherein the at least one stack node pre-charging transistor comprises a pre-charging PMOS transistor including a gate, a source and a drain,
   the gate of the pre-charging PMOS transistor being coupled to receive a NMOS closing clock through two inverters, the source of the pre-charging PMOS transistor being coupled to a drain of a first PMOS transistor of the multiple input conditional inverter and the drain of the pre-charging PMOS transistor being coupled to the high signal transfer node.

7. A circuit comprising:
   a first transistor, the first transistor having a control terminal, an input terminal, and an output terminal, wherein the control terminal is coupled to receive a third clock signal and the input terminal is coupled to a positive supply voltage;
   a second transistor, the second transistor having a control terminal, an input terminal, and an output terminal, wherein the control terminal is coupled to receive a data input signal and the input terminal is coupled to the output terminal of the first transistor;
   a third transistor, the third transistor having a control terminal, an input terminal, and an output terminal, wherein the control terminal is coupled to receive a first clock signal and the input terminal is coupled to the output terminal of the second transistor;
   a fourth transistor, the fourth transistor having a control terminal, an input terminal, and an output terminal, wherein the control terminal is coupled to receive a second clock signal and the output terminal is coupled to the output terminal of the third transistor;
   a fifth transistor, the fifth transistor having a control terminal, an input terminal, and an output terminal, wherein the control terminal is coupled to receive the input data signal and the output terminal is coupled to the input terminal of the fourth transistor;

a sixth transistor, the sixth transistor having a control terminal, an input terminal, and an output terminal, wherein the control terminal is coupled to receive a fourth clock signal, the output terminal is coupled to the input terminal of the fifth transistor, and input terminal is coupled to a supply voltage less positive than the positive supply voltage;

at least one stack node pre-charging transistor coupled to charge a node between the second transistor and the third transistor;

at least one stack node pre-discharging transistor coupled to discharge a node between the fourth transistor and the fifth transistor;

a first inverter, the first inverter having an input and an output, wherein the input is coupled to receive the first clock signal and the output is coupled to the second clock signal;

a second inverter, the second inverter having an input and an output, wherein the input is coupled to the output terminal of the first inverter to receive the second clock signal;

a third inverter, the third inverter having an input and an output, wherein the input is coupled to the output terminal of the second inverter and the output is coupled to the third clock signal;

a fourth inverter, the fourth inverter having an input and an output, wherein the input is coupled to the output terminal of the third inverter to receive the third clock signal, and the output is coupled to the fourth clock signal;

a keeper circuit, the keeper circuit having an input and output, wherein the input and output are coupled to the output terminal of the third transistor; and a buffer, the buffer having an input and an output, wherein the buffer input is coupled to the output terminal of the third transistor, and the buffer output is a flip-flop latched output signal.

8. The circuit of claim 7 wherein the at least one stack node pre-charging transistor comprises a first pre-charging transistor including a gate, a source and a drain, and a second pre-charging transistor including a gate, a source and a drain, the source of the first pre-charging transistor being coupled to the positive supply voltage, the drain of the first pre-charging transistor being coupled to the source of the second pre-charging transistor, the drain of the second pre-charging transistor being coupled to the node between the second transistor and the third transistor.

9. The circuit of claim 8 wherein the gate of the first pre-charging transistor is coupled to receive the fourth clock signal and the gate of the second pre-charging transistor is coupled to receive the second clock signal.

10. The circuit of claim 7 wherein the at least one stack node pre-discharging transistor comprises a first pre-discharging transistor including a gate, a source and a drain, and a second pre-discharging transistor including a gate, a source and a drain, the drain of the first pre-discharging transistor being coupled to the node between the fourth transistor and the fifth transistor, the source of the first pre-discharging transistor being coupled to the drain of the second pre-discharging transistor, and the drain of the second pre-discharging transistor being coupled to a supply voltage less positive than the positive supply voltage.

11. The circuit of claim 10 wherein the gate of the first pre-discharging transistor is coupled to receive the first clock signal and the gate of the second pre-discharging transistor is coupled to receive the fourth clock signal.

12. The circuit of claim 7 further comprising:

a fifth inverter, the fifth inverter having an input and an output, wherein the input is coupled to the output terminal of the fourth inverter to receive the fourth clock signal; and a sixth inverter, the sixth inverter having an input and an output, wherein the input is coupled to the output terminal of the fifth inverter.

13. The circuit of claim 12 wherein the at least one stack node pre-discharging transistor comprises a first pre-discharging transistor including a gate, a source and a drain, and a second pre-discharging transistor including a gate, a source and a drain, the drain of the first pre-discharging transistor being coupled to the node between the fourth transistor and the fifth transistor, the source of the first pre-discharging transistor being coupled to the drain of the second pre-discharging transistor, and the drain of the second pre-discharging transistor being coupled to a supply voltage less positive than the positive supply voltage, and wherein the gate of the first pre-discharging transistor is coupled to receive the output of the fifth inverter and the gate of the second pre-discharging transistor is coupled to receive the output of the second inverter.

14. The circuit of claim 12 wherein the at least one stack node pre-charging transistor comprises a pre-charging transistor including a gate, a source and a drain, the gate of the pre-charging transistor being coupled to the output of the sixth inverter, the source of the pre-charging transistor being coupled to the drain of the first transistor and the drain of the pre-charging transistor being coupled to the node between the second transistor and the third transistor.

15. The circuit of claim 7 wherein the circuit is a flip-flop circuit.

* * * * *

UNITED STATES PATENT AND TRADEMARK OFFICE
CERTIFICATE OF CORRECTION

PATENT NO.   : 6,429,711 B1
DATED        : August 6, 2002
INVENTOR(S)  : Tschanz et al.

It is certified that error appears in the above-identified patent and that said Letters Patent is hereby corrected as shown below:

Column 4,
Line 20, delete "s_$c_{13}$ n" and insert -- s_c_n --.
Line 32, delete "s_C-n" and insert -- s_c_n --.
Line 33, delete "C_c_n" and insert -- s_c_n --.
Line 34, delete "s_C_n" and insert -- s_c_n --.

Signed and Sealed this

Eighteenth Day of February, 2003

JAMES E. ROGAN
*Director of the United States Patent and Trademark Office*